(12) United States Patent
Gradinariu et al.

(10) Patent No.: US 9,438,240 B1
(45) Date of Patent: Sep. 6, 2016

(54) BIASING CIRCUIT FOR LEVEL SHIFTER WITH ISOLATION

(71) Applicant: Cypress Semiconductor Corporation, San Jose, CA (US)

(72) Inventors: Iulian C. Gradinariu, Colorado Springs, CO (US); Jayant Ashokkumar, Colorado Springs, CO (US); Bogdan Samson, Colorado Springs, CO (US); Vijay Raghavan, Colorado Springs, CO (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 14/965,738

(22) Filed: Dec. 10, 2015

Related U.S. Application Data

(60) Provisional application No. 62/212,237, filed on Aug. 31, 2015.

(51) Int. Cl.
  *G05F 1/10* (2006.01)
  *H03K 19/0185* (2006.01)
  *G11C 7/12* (2006.01)
  *G11C 7/22* (2006.01)

(52) U.S. Cl.
  CPC ......... *H03K 19/018507* (2013.01); *G11C 7/12* (2013.01); *G11C 7/22* (2013.01)

(58) Field of Classification Search
  None
  See application file for complete search history.

(56) References Cited

U.S. PATENT DOCUMENTS

| | | | |
|---|---|---|---|
| 5,341,047 A | 8/1994 | Rosenthal | |
| 5,754,037 A | 5/1998 | Ezell et al. | |
| 6,788,125 B1 | 9/2004 | Tomsio | |
| 7,199,617 B1 | 4/2007 | Schrom et al. | |
| 7,199,638 B2 | 4/2007 | Dubey et al. | |
| 7,319,356 B1 | 1/2008 | Karim | |
| 7,554,379 B2 | 6/2009 | Pilling et al. | |
| 2006/0103455 A1* | 5/2006 | Zhang | G05F 3/247 327/543 |
| 2007/0115041 A1* | 5/2007 | Tachibana | H03K 3/356113 327/333 |
| 2012/0268189 A1* | 10/2012 | Rossi | H03K 19/018521 327/333 |

OTHER PUBLICATIONS

Huang, "A Dynamically Controlled and Refreshed Low-Power Level-up Shifter", Circuits and Systems, 2004. MWSCAS '04. The 2004 47th Midwest Symposium on (vol. 1 ), 4 pages.
Search Report for "Biasing Circuit for Level Shifter With Isolation", dated Oct. 2015, 23 pages.

\* cited by examiner

*Primary Examiner* — Long Nguyen
(74) *Attorney, Agent, or Firm* — Lowenstein Sandler LLP

(57) ABSTRACT

A circuit includes a biasing circuit that includes a load circuit coupled to a first node. The biasing circuit can output a biasing signal on the first node. The biasing circuit also includes a timer component and a current source. An input of the timer component is coupled to receive an isolation signal. The current source is configured to inject current for a period of time into the load circuit in response to a transition of the ISO signal between a high voltage and a low voltage. The biasing circuit also includes circuitry to generate an isolation delayed (ISO_DEL) signal. The ISO_DEL signal has a high voltage in response to the biasing signal being within a first threshold level and the ISO_DEL signal has a low voltage in response to the biasing signal being within a second threshold level. The biasing circuit outputs the ISO_DEL signal.

20 Claims, 7 Drawing Sheets

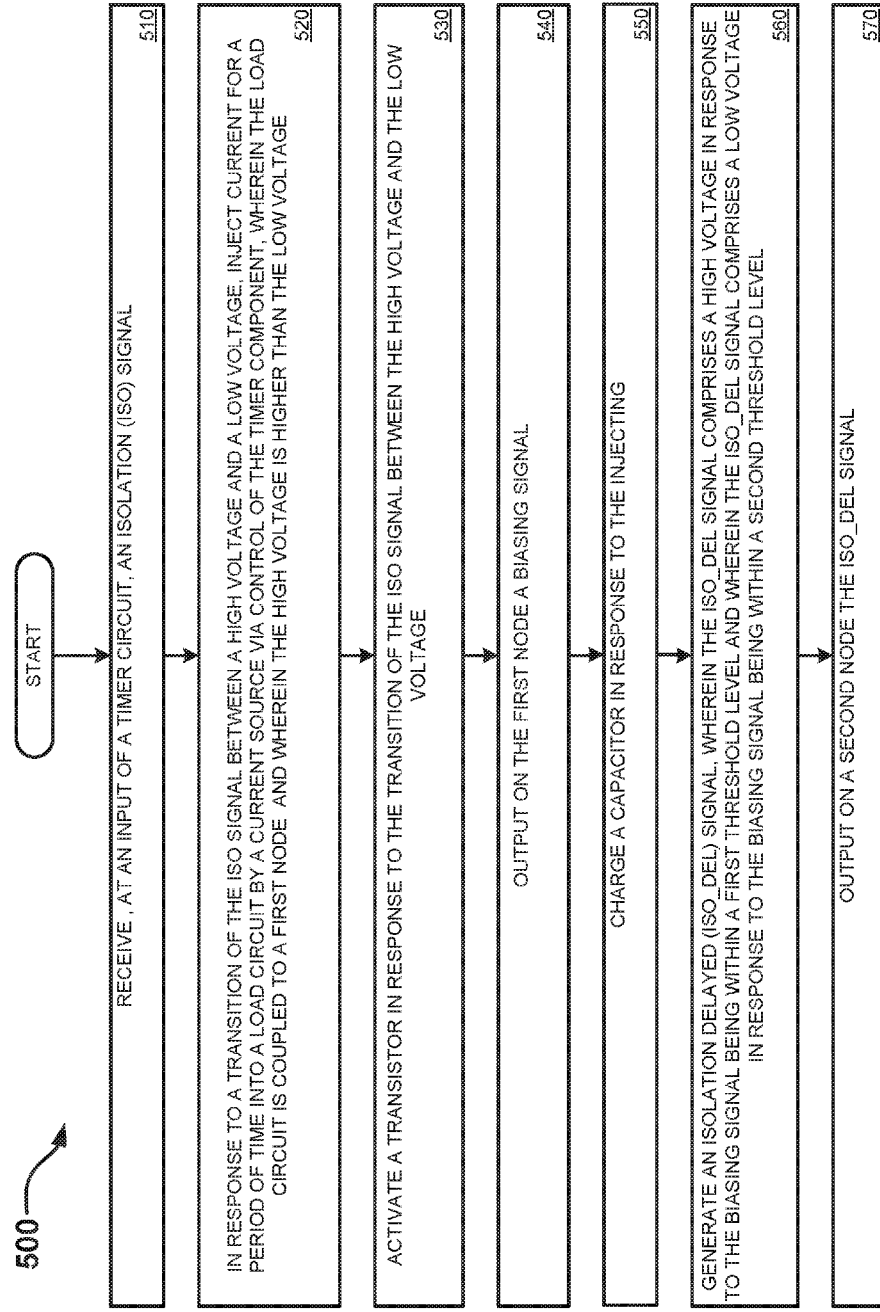

BIASING CIRCUIT FOR LEVEL SHIFTER WITH ISOLATION

RELATED APPLICATIONS

This application claims the benefit of U.S. Provisional Application No. 62/212,237, filed on Aug. 31, 2015, the content of which is hereby incorporated by reference herein.

BACKGROUND

Level shifters are used within circuit devices to shift input signals that are in one power domain to another power domain. Signals in one power domain may be low voltage (LV) signals, while signals in a different power domain may be high voltage (HV) signals. Shifting of HV and LV signals may be performed for purposes of compatibility. For example, if a component in a circuit device requires a signal to be in one domain, and an input signal is in a different domain, the signal needs to be shifted into the different domain. LV signals may be within a range of the power supply of a device utilizing the level shifters and HV signals may be all signals out of the range of the power supply.

BRIEF DESCRIPTION OF THE DRAWINGS

The present disclosure is illustrated by way of example, and not by way of limitation, in the figures of the accompanying drawings.

FIG. 5 is flow diagram illustrating biasing provided during transition of an isolation signal between a high voltage and a low voltage according to one embodiment.

DETAILED DESCRIPTION

Figure 1:
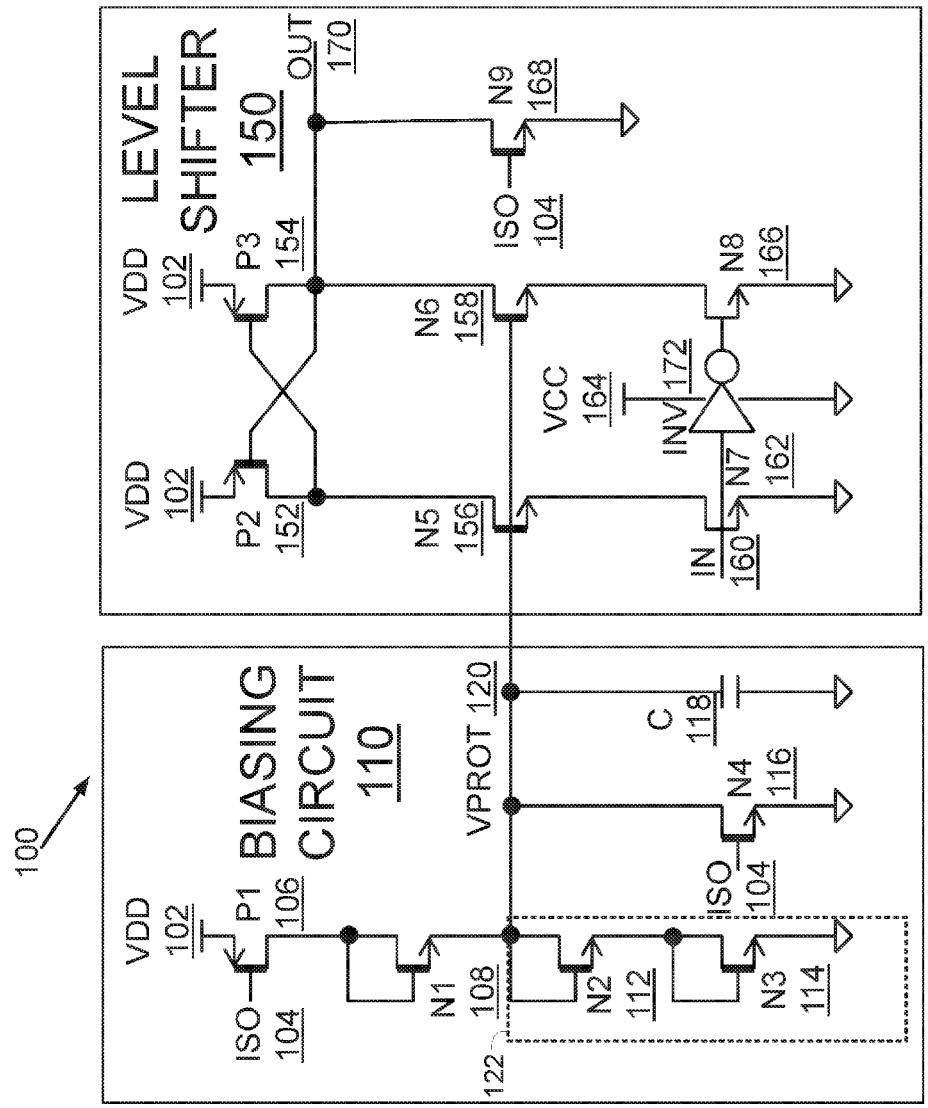
FIG. 1 illustrates a circuit schematic of a first biasing circuit and a level shifter, according to one embodiment.

One or more level shifters may be biased by a single biasing circuit. The biasing circuit provides input signals to each of the one or more level shifters. The one or more level shifters can perform a power domain transition which occurs when a signal that is input into a level shifter in one domain needs to be transformed into another signal in another domain. Once the one or more level shifters perform the proper transformation, the output signal that is transformed can be provided to high voltage logic for further processing.

Level shifters may be used by a memory device to provide output signals to high voltage logic in an array of the memory device. The memory device may be a non-volatile memory (NVM) device that is used in electronic components. An NVM device requires the retention of information when electrical power is not available. NVM devices may include read-only-memory (ROM), programmable-read-only memory (PROM), erasable-programmable-read-only memory (EPROM), electrically-erasable-programmable-read-only-memory (EEPROM) devices, FLASH cell memory, non-volatile Static RAM (nvSRAM), Ferro Electric Random Access Memory (FRAM). Some memory arrays utilize transistors and gate structures which may include a memory element or charge storage layer. The charge storage layer may be programmed to store data based on voltages applied to or received by the memory array. The voltages may be applied by level shifters. In an embodiment, the memory array may be a silicon oxide nitride oxide silicon (SONOS) type memory array.

Level shifters biased by a biasing circuit may both be utilized by NVM devices. Level shifters and a biasing circuit may be utilized by devices other than memory devices. A biasing circuit biasing multiple level shifters may be utilized by any device requiring power domain transition.

During power domain transition, a level shifter transforms a signal from one power domain to another signal in another power domain. The biasing circuit may input a first signal (i.e., a biasing signal) into the level shifter to activate the level shifter. When the level shifter is activated, the level shifter can transform a second signal in one domain into a third signal in another domain. The level shifter may be in an uncertain state for a period of time during which the biasing circuit provides the signal to the level shifter. A level shifter that is placed in an uncertain state may lead to errors in the device that requires the power domain transition.

Furthermore, during the power domain transition, a biasing circuit that biases multiple level shifters includes a parasitic capacitance that is dependent upon the number of level shifters coupled to receive an input from the biasing circuit. As the number of level shifters increases, the parasitic capacitance of the biasing circuit may reach a considerable size. Charging up a capacitor of a considerable size by the biasing circuit may require additional time which may create a delay in activation of the level shifters.

The embodiments described herein are directed to biasing circuits that are used to bias level shifters. The embodiments of the biasing circuits that may eliminate the uncertain state of the level shifters and decrease the delay in activating the level shifters.

In an embodiment, a circuit includes a level shifter and a biasing circuit coupled to the level shifter. The biasing circuit outputs a biasing signal on a first node to the level shifter. The first node is coupled to the level shifter. The biasing signal may be called a voltage protection "VPROT" signal that activates the level shifter to transform an input signal in one domain into another output signal in another domain. The biasing circuit includes a load circuit that is coupled to the first node. The biasing circuit further includes a timer component and a current source. The timer component controls injection of current (i.e., additional current) by the current source into the load circuit. A transistor is included within a first branch. The timer component is coupled to the transistor. A second branch includes another transistor. The first and second branches are coupled to the first node. An input of the timer component is coupled to receive an isolation (ISO) signal. The current source is configured to inject the current for a period of time into the load circuit, as determined by the timer component, in response to a transition of the ISO signal between a high voltage and a low voltage. Standby current is also injected into the load circuit, via control of the second branch. The injection of the current (including standby current) into the load circuit provides for quickly charging up a capacitor included in the biasing circuit. The capacitor is coupled between the first node and a ground potential. When the current source ceases injection of the additional current into the load circuit at the end of the period of time, the standby current continues to be injected into the load circuit.

The biasing circuit further includes circuitry to generate an isolation delayed (ISO_DEL) signal. The ISO_DEL signal includes a high voltage in response to the VPROT signal being within a first threshold level. The ISO_DEL signal includes a low voltage in response to the VPROT signal being within a second threshold level. The first threshold level includes a voltage range between 0V and a threshold level voltage. The second threshold level includes a voltage range between the threshold voltage level and a maximum voltage. The biasing circuit may output the ISO_DEL signal to the level shifter on a second node.

Embodiments of the biasing circuit may ensure that the level shifter is not left in an uncertain state during power domain transition. Additionally, the embodiments of the biasing circuit may charge up a capacitor as quickly as possible in order to minimize a delay in activating the level shifter.

Figure 4A:
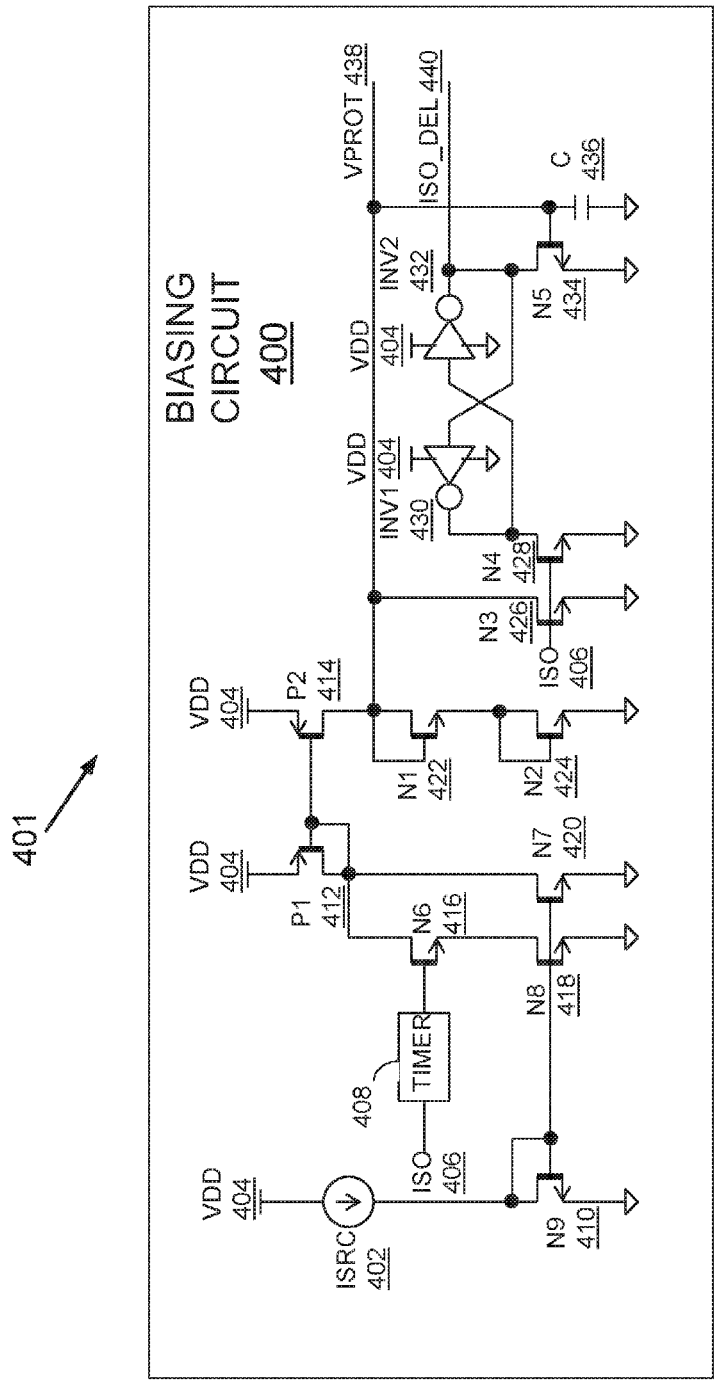
FIG. 4A illustrates a circuit schematic of a third biasing circuit, according to another embodiment.
Figure 4B:
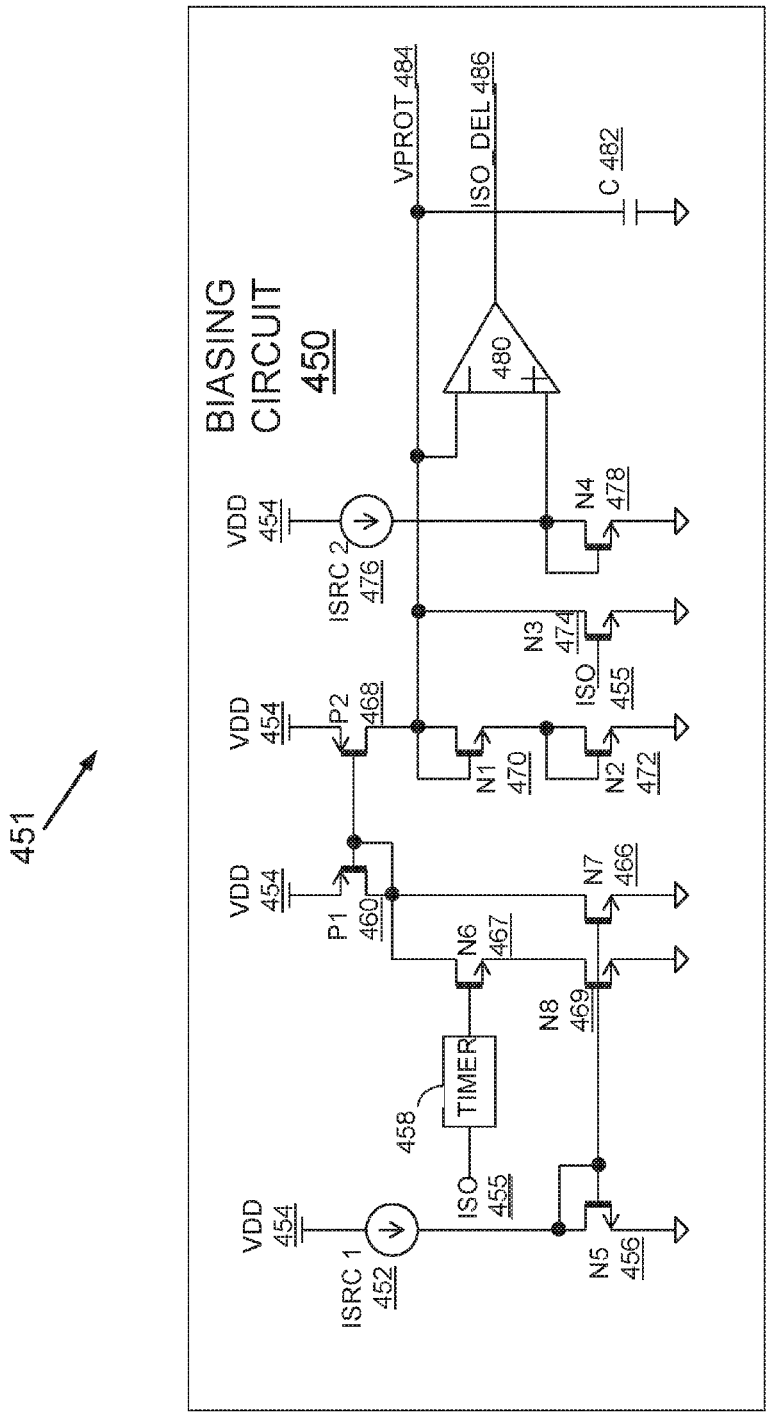
FIG. 4B illustrates a circuit schematic of a fourth biasing circuit, according to another embodiment.

FIGS. 1, 2, 4A and 4B described herein include level shifters and/or biasing circuits. Although FIGS. 1 and 2 each depict a single level shifter, the biasing circuits in these figures may be coupled to additional level shifters. For example, a single biasing circuit may be coupled to approximately 2400 level shifters. Each of the level shifters may be physically laid out in parallel to one another and each of the level shifters may be coupled to a single biasing circuit to input a signal called the VPROT signal via a node that carries the VPROT signal. Further, although FIGS. 4A and 4B depict biasing circuits, one or more level shifters (not depicted) may be coupled to each of the biasing circuits. For example, the level shifters depicted in FIGS. 1 and 2 may be coupled to the biasing circuits of FIGS. 4A and 4B. In another embodiment FIGS. 2, 4A and 4B may be coupled to other known level shifters (not depicted) and are not limited by the level shifters depicted in FIGS. 1 and 2. In an embodiment, level shifter(s) that are coupled to the biasing circuits may be low voltage (LV) to high voltage (HV) level shifter(s) having cascode-protected LV pull-down devices.

FIGS. 1, 2, 4A and 4B include transistors that may be 4-terminal transistors including a gate, source, drain, and bulk. The transistors may be N-channel metal oxide semiconductor field-effect transistors (nMOSFETs or "NMOS") or P-channel metal oxide semiconductor field-effect transistors (pMOSFETs or "PMOS"). NMOS are labeled as beginning with the letter "N" and PMOS are labeled as beginning with the letter "P". FIGS. 1, 2, 4A and 4B include different types of NMOS and PMOS transistors. The transistors (N7) 162 and (N8) 166 in FIG. 1 and the transistors (N8) 266 and (N9) 270 in FIG. 2 may be 4-terminal transistors that are pass transistors including a gate, source, drain, and bulk. The other transistors depicted in FIGS. 1, 2, 4A and 4B may be memory transistors. The pass transistors may be N-channel metal oxide semiconductor field-effect transistors (nMOSFET).

In one embodiment, the memory transistors depicted in FIGS. 1, 2, 4A and 4B are extended drain transistors. Extended drain transistors have an additional implant (either an N-type dopant for an nMOSFET or a P-type dopant for pMOSFET) in the drain making the drain longer and the transistor no longer symmetrical. Extended drain transistors may be illustrated by having a rectangle located in the drain of the transistor, as illustrated in FIGS. 1, 2, 4A and 4B. An extended drain transistor may be able to withstand a higher voltage differential (than a non-extended drain transistor) between the terminals of extended drain transistor, when the transistor is off. For example, an extended drain 5V transistor or an extended drain 9V transistor may withstand voltages of 5V or 9V, respectively, between the drain and source, the gate and drain, but not between the gate and source. A MOSFET without an extended drain, such as the pass transistor (N8) 266 in FIG. 2, may only be able to withstand a voltage differential of roughly 1.4V between any of the transistor's terminals, for example. An extended drain transistor may have a higher safe operating area (SOA) when off because the extended drain transistor may be able to withstand higher voltage differentials across particular terminals, as described above. However when turned on, the extended drain transistor may have an SOA with lower voltage differentials (e.g., 3.6V).

Figure 2:
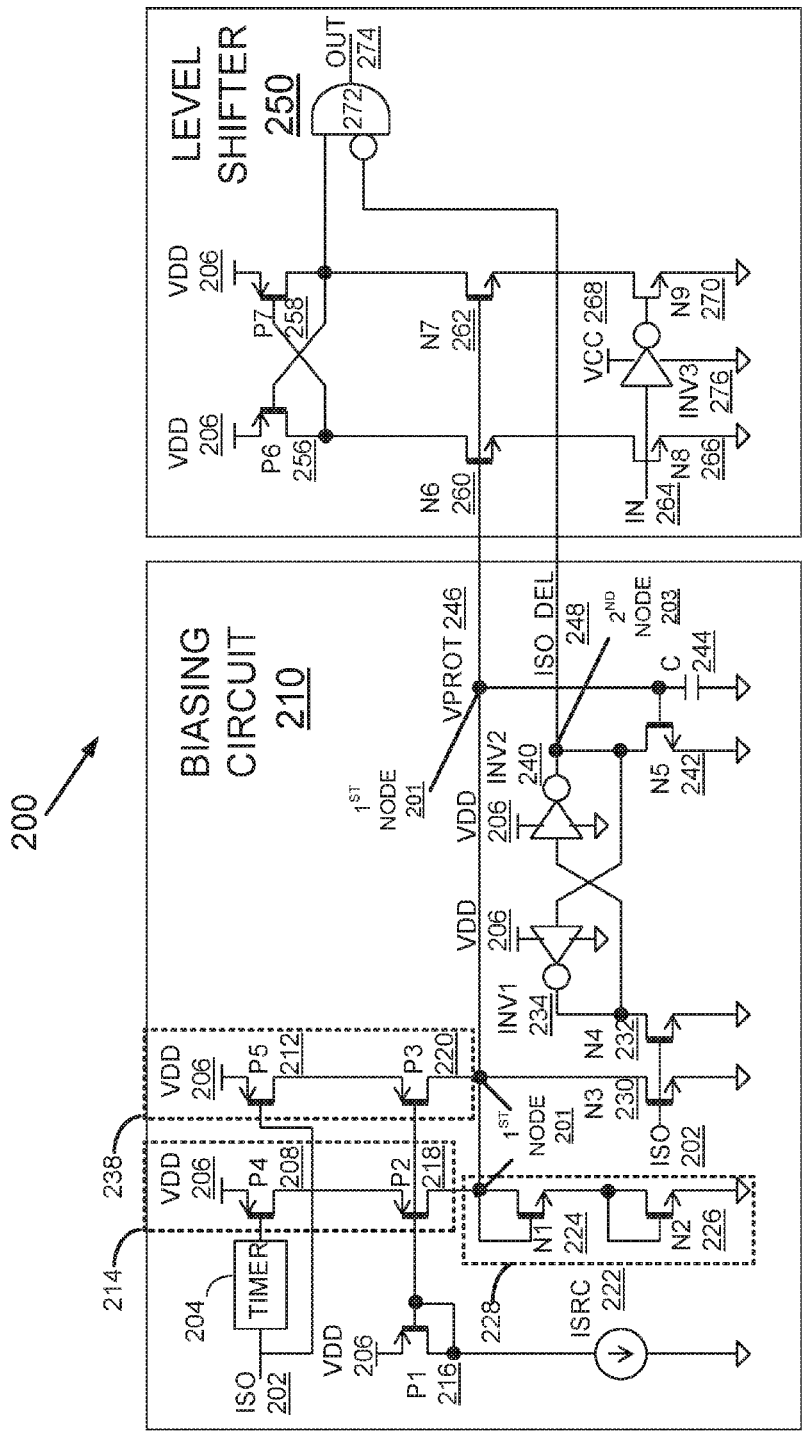
FIG. 2 illustrates a circuit schematic of a second biasing circuit and a level shifter, according to one embodiment.

In another embodiment, one or more of the transistors depicted in FIGS. 2, 4A and 4B may be implemented using cascoded transistors biased to protect the circuit for over-voltage stress while maintaining SOA. In still another embodiment, the transistors of FIGS. 2, 4A, and 4B may be implemented using transistors using a thicker gate oxide capable of supporting high direct voltages, such as 4.7V. Transistors using a thicker gate oxide may be implemented with a process using a third gate oxide. However this would require a more complicated technology which would allow a third gate oxide layer.

In an embodiment where the biasing circuit and level shifter in FIGS. 1, 2, 4A and 4B are utilized by an NVM device, the biasing circuit and the level shifters may be provided within a memory array of the NVM device.

Although the same reference numerals may be assigned to different signals in FIGS. 1, 2, 4A, and 4B, the signals may be input by different sources. For example, in FIG. 1, the ISO signal is represented by reference numeral 104. The ISO signal may be supplied by one or more sources and is not limited to being supplied by a single source.

The ground potential depicted in FIGS. 1, 2, 4A, and 4B is at 0V. The terms ground potential, ground and/or 0V are used interchangeably herein.

FIG. 1 illustrates a circuit schematic 100 of a first biasing circuit and a level shifter, according to one embodiment. A biasing circuit 110 is coupled to a level shifter 150.

The biasing circuit 110 includes a VDD signal 102, an isolation (ISO) signal 104, a transistor (P1) 106, a transistor (N1) 108, a transistor (N2) 112, a transistor (N3) 114, a transistor (N4) 116, a capacitor (C) 118, and an output VPROT node 120 carrying a VPROT signal.

In the biasing circuit 110, a gate of the transistor (P1) 106 as well as a gate of the transistor (N4) is coupled to receive the ISO signal 104. A source of the transistor (P1) 106 is coupled to receive the VDD signal 102 and a drain of the transistor (P1) 106 is coupled to the drain of the transistor (N1) 108. A gate of the transistor (N1) 108 is also coupled to its drain and to the drain of the transistor (P1) 106. A source of the transistor (N1) 108 is coupled to the VPROT node 120 carrying the VPROT signal. The VPROT node 120 is also coupled to a drain of the transistor (N2) 112, a gate of the transistor (N2) 112, and a drain of the transistor (N4) 116. A source of the transistor (N2) 112 is coupled to a drain and a gate of the transistor (N3) 114. A source of the transistor (N3) 114 and a source of the transistor (N4) 116 is coupled to ground (0V). The capacitor (C) 118 is also coupled to ground (0V).

The level shifter 150 includes an input signal IN 160, a VDD signal 102, a transistor (P2) 152, a transistor (P3) 154, a transistor (N5) 156, a transistor (N6) 158, a transistor (N7) 162, a VCC signal 164, a transistor (N8) 166, a transistor (N9) 168, an inverter 172, and an output signal OUT 170.

The inverter 172 may include a complementary pair of MOSFETs (e.g., a PMOS and an NMOS). In the inverter 172, the drains of each set of NMOS and PMOS are coupled to each other. The inverter 172 may also be referred to as a complementary metal-oxide semiconductor (CMOS) having an NMOS and PMOS.

In the level shifter 150, a gate of the transistor (N7) as well as an input to the inverter 172 is coupled to receive the input signal IN 160. The inverter 172 is biased by the VCC signal 164 and ground (0V). A source of the transistor (P2) 152 and a source of the transistor (P3) 154 are each coupled to receive the VDD signal 102. A gate of the transistor (P2) 152 is coupled to a drain of the transistor (P3) 154, which is coupled to output the output signal OUT 170. The drain of the transistor (P3) 154 is also coupled to a drain of the transistor (N6) 158. A drain of the transistor (P2) 152 is coupled to a gate of the transistor (P3) 154 and is also coupled to a drain of the transistor (N5) 156. A drain of the transistor (N9) 168 is also coupled to output the output signal OUT 170. A gate of the transistor (N9) 168 is coupled to receive the ISO signal 104. A source of the transistor (N9) 168 is coupled to ground (0V). A gate of the transistor (N5) 156 and a gate of the transistor (N6) 158 are each coupled to the VPROT node 120, which carries the VPROT signal received from the biasing circuit 110. A source of the transistor (N5) 156 is coupled to a drain of the transistor (N7) 162. A source of the transistor (N7) 162 is coupled to ground (0V). A drain of the transistor (N8) 166 is coupled to a source of the transistor (N6) 158. A source of the transistor (N8) 166 is coupled to ground (0V). A gate of the transistor (N8) 166 is coupled to receive the output of the inverter 172.

The VCC signal 164 is a low voltage domain signal which is in a section of circuitry supplied from a low voltage source. The VCC signal 164 is down-regulated from an external power supply.

The VDD signal 102 is a high voltage domain signal which is in a section of circuitry supplied from a high voltage source (e.g., the external power supply).

In a level shifter, power domain transition occurs when a given power domain source (VCC or VDD) transitions from not being active/not being present (i.e., floating) to being active/present (i.e., being driven to either ground or a steady direct current (DC) value).

The level shifter 150 may shift a low voltage domain input signal IN 160 to a high voltage domain output signal OUT 170 when the high voltage ISO signal 104 is low. The level shifter 150 may output the high voltage domain output signal OUT 170 when the biasing circuit 110 provides an appropriate biasing signal called the "VPROT" signal at the VPROT node 120. The VPROT signal is grounded as long as the ISO signal 104 is high. The VPROT signal is set to an appropriate value when the ISO signal 104 is low.

The capacitor (C) 118 in the biasing circuit 110 is a parasitic capacitor. As described above, multiple level shifters may be coupled to the biasing circuit 110. Each of the level shifters may be physically laid out in parallel to one another and each of the level shifters may be coupled to input the VPROT signal from the VPROT node 120. Therefore, due to the multiplicity of the level shifters, the capacitor (C) 118 carries a parasitic capacitance. The capacitance of the capacitor (C) 118 may be considerable in size due to the multiplicity of the level shifters. A capacitor able to withstand high capacitance may be needed in the biasing circuit for the multiple level shifters. In an embodiment, the capacitor (C) 118's size may be on the order of 50-100 pico Farads in order for the biasing circuit 110 to be able to control multiple level shifters 150.

During power domain transition in the level shifter 150 (and in additional level shifters not shown), there may be significant delay until a signal is input into the level shifters 150 by the biasing circuit 110. This delay may cause a slow startup time for the level shifters. During power domain transition, the ISO signal 104 is transitioned to ground. A gate of the transistor (P1) 106 is coupled to receive the ISO signal 104. As the ISO signal 104 is ground, the transistor (P1) 106 is biased by the VDD signal 102, which acts as the source of the transistor (P1) 106. The VDD signal 102 biases the transistor (N1) 108, and current is injected into a diode stack 122 (which includes the transistor (N2) 112 and the transistor (N3) 114) via the transistor (P1) 106. The transistors (N2) 112 and (N3) 114 are diode connected. The transistor (N2) 112 and the transistor (N3) 114 are activated/on. The transistor (N4) 116 is also activated/on. During the time when the ISO signal 104 is transitioning from HV to ground and current is injected into the diode stack 122, there may be a significant delay in charging up the capacitor (C) 118 in order to bring the VPROT signal carried by the VPROT node 120 to an appropriate level in order to activate the transistors (N5) 156 and (N6) 158 (as well as other similar transistors laid out in additional level shifters coupled to the VPROT node 120). Thus, this delay in the power domain transition from the moment the ISO signal 104 is grounded and the moment that the level shifter 150 (and other level shifters) becomes operational (i.e., the transistors (N5) 156 and (N6) 158 are activated) may be significant. In an embodiment, the delay is dependent upon the number of level shifters. Therefore, the greater the number of level shifters coupled to the VPROT node 120 and the biasing circuit 110, the greater the delay. Thus, the circuit schematic 100 may not provide an optimization of response time (when the level shifter(s) become operational) versus current consumption (i.e., the current consumed by the biasing circuit 110).

During the delay period described above, the ISO signal 104 may have been grounded, but the level shifter 150 has not yet become operational. When the ISO signal 104 is grounded and the level shifter 150 is not operational, the output signal OUT 170 may be in a potential uncertain state. When the output signal OUT 170 is in a potential uncertain state, the level shifter 150 may output an erroneous invalid logical signal at OUT 170 which may lead to errors in a device requiring power domain transition.

In another embodiment, the ISO signal 104 may be a high voltage signal in a HV domain. When the ISO signal 104 is in a HV domain, the VPROT signal of the biasing circuit 110 is turned off and when the VPROT signal input into the level shifter 150 is turned off, the output signal OUT 170 should be grounded. Thus, the level shifter 150 ought to be disabled when the ISO signal 104 is in a HV domain and the output signal OUT 170 ought to be in a valid binary logic state (i.e., either at 1 or 0). However, due to the delay described above, the output signal OUT 170 may instead be in an erroneous invalid logic state.

In yet another embodiment, when the ISO signal 104 is a low voltage signal in a LV domain, current is injected into the diode stack 122. The LV domain may be between 0V and 1.2V, for example. The VPROT signal is then brought to a maximum voltage level above ground such as two times VTN (2*VTN). The output signal OUT 170 of the level shifter 150 needs to be brought to a HV domain signal for the level shifter 150 to be in a certain state. The VDD signal 102 of the level shifter 150 may be in a HV domain and may either be a negative voltage in the HV domain or a positive voltage in the HV domain. The level shifter 150 may experience a delay which may lead to the output signal OUT 170 to be in an erroneous invalid logic state.

Furthermore, the level shifter 150 may not guarantee isolation during power mode transition. A circuit with isolation means that if a VDD signal is active/present and a VCC signal is not active/not present (i.e., the VCC signal floats), the circuit output signal(s) are in a determined valid logic state. For example, during power mode transition, the transistors (N5) 156 and (N6) 158 may float and isolation cannot be provided/guaranteed when these transistors are in a floating state. While the VPROT signal ramps up from ground to HV, the transistors (N5) 156 and (N6) 158 are deactivated/off for a period of time while they do not have enough voltage on their gates in order to turn on. This may enable the output signal OUT 170 to output any signal as determined by the transistors (P2) 152 and (P3) 154. That is, any signal that is left on the drains of the transistors (P2) 152 and (P3) 154 may erroneously output to OUT 170 while the transistors (N5) 156 and (N6) 158 are off. OUT 170 may be in an erroneous invalid logic state. Therefore, no attempt is made at isolating the level shifter 150 during the power domain transition.

In order to address these issues, the VPROT signal that is received by one or more level shifters should be output by a biasing circuit that has low direct current (DC) consumption, has a faster response time from the moment an ISO signal toggles from high-to-low to the moment that the VPROT signal reaches its steady DC value, and can guarantee isolation during a ramping up period of the VPROT signal (i.e., when the VPROT signal transitions from a low voltage to a high voltage). The VPROT signal ramps up in order to turn on/activate appropriate transistors in the level shifter, where the gates of the transistors are coupled to a node carrying the VPROT signal.

The biasing circuit should optimize a response time (i.e., a time that required to charge up a VPROT signal to an appropriate level as fast as possible without burning excessive current in standby). The biasing circuit should also ensure that during the ramping up period of the VPROT signal, the level shifter is not left in an uncertain state where the output of the level shifter can be anything due to the floating of the transistors in the level shifter.

For purposes of brevity and simplicity, the embodiments depicted in FIGS. 1, 2, 4A, and 4B describe diode stacks. However, a load circuit or a load stack may be provided instead of the depicted diode stack. In an embodiment, a load circuit may be a diode stack including a plurality of transistors connected by one or more diodes. In another embodiment, the load circuit or diode stack may be an operational amplifier which can be used for generating the VPROT signal. Therefore, in place of a diode stack, a load circuit or an operational amplifier may be used which would output a voltage based on the bandgap reference voltage.

FIG. 2 illustrates a circuit schematic 200 of a second biasing circuit and a level shifter, according to one embodiment. A biasing circuit 210 is coupled to a level shifter 250.

In an embodiment, the level shifter 250 is with isolation. A circuit with isolation means that if a VDD signal is active/present and a VCC signal is not active/not present (i.e., the VCC signal floats), the circuit output signal(s) are in a determined valid logic state.

The biasing circuit 210 includes an isolation (ISO) signal 202, a timer component 204, a VDD signal 206, a transistor (P4) 208, a transistor (P5) 212, a transistor (P1) 216, a transistor (P2) 218, a transistor (P3) 220, a current source ISRC 222, a transistor (N1) 224, a transistor (N2) 226, a transistor (N3) 230, a transistor (N4) 232, an inverter (INV1) 234, an inverter (INV2) 240, a transistor (N5) 242, a capacitor (C) 244, an output VPROT signal 246, and an output isolation delay (ISO_DEL) signal 248. The capacitor (C) 244 is a parasitic capacitor between the first node 201 and ground (0V).

A first branch 214 includes a pair of transistors (P4) 208 and (P2) 218. The first branch 214 is outlined using dashed lines. A second branch 238 includes a pair of transistors (P5) 212 and (P3) 220. The second branch 238 is outlined using dashed lines. A diode stack 228 includes the diode-connected transistors (N1) 224 and (N2) 246. The diode stack 228 is outlined using dashed lines. The diode stack 228 may further encompass a first node 201. The first node 201 carries the VPROT signal 246. A second node 203 carries the ISO_DEL signal 248.

Each of the inverters (INV1) 234 and (INV2) 240 may include a complementary pair of MOSFETs (e.g., a PMOS and an NMOS). In each of the inverters (INV1) 234 and (INV2) 240, the drains of each set of NMOS and PMOS are coupled to each other. The inverters (INV1) 234 and (INV2) 240 may also be referred to as CMOSs having an NMOS and PMOS. The inverters (INV1) 234 and (INV2) 240 may also be referred to as a full latch.

The timer component 204 connects to circuitry to control the current source ISRC 222. The timer component 204 is a timer that keeps time. The timer generates a pulse when ISO signal 202 transitions between HV and LV. The timer generates a pulse and then stops generating the pulse when the timer is reset. The timer may be reset when a certain condition is met. For example, the timer is reset at a time when enough current is injected into the diode stack 228 so that the VPROT signal 246 approximately reaches a maximum voltage level. The current source ISRC 222 injects current, via control of the first branch 214, into the diode stack 228, until the VPROT signal 246 approximately reaches the maximum voltage level. The current source ISRC 222 may inject this current (which is additional current) via the first branch 214 in an active mode and/or during power up of the biasing circuit 210. In an embodiment, the timer component 204 is coupled to receive the ISO signal 202.

A gate of the transistor (P4) 208 is coupled to the output of the timer component 204. A source of the transistor (P4) 208 is coupled to receive the VDD signal 206. A drain of the transistor (P4) 208 is coupled to a source of the transistor (P2) 218. A source of the transistor (P5) 212 is coupled to receive the VDD signal 206. A gate of the transistor (P5) 212 is coupled to receive the ISO signal 202. A drain of the transistor (P5) 212 is coupled to a source of the transistor (P3) 220. A source of the transistor (P1) 216 is coupled to receive the VDD signal 206. A drain of the transistor (P1) 216 is coupled to the current source ISRC 222. The ISRC 222 is coupled to ground. The drain of the transistor (P1) 216 is also coupled to a gate of the transistor (P1) 216. The gate of the transistor (P1) 216 is also coupled to a gate of the transistor (P2) 218. The gate of the transistor (P2) 218 is also coupled to a gate of the transistor (P3) 220. A drain of the transistor (P2) 218 is coupled to the first node 201 which carries the VPROT signal 246. A drain of the transistor (P3) 220 is coupled to the first node 201. A drain of the transistor (N1) 224 is also coupled to the first node 201. A gate of the transistor (N1) 224 is also coupled to the first node 201. A source of the transistor (N1) 224 is coupled to a drain of the transistor (N2) 226. A gate of the transistor (N2) 226 is also coupled to the drain of the transistor (N2) 226. A source of the transistor (N2) 226 is coupled to ground (0V). A drain of the transistor (N3) 230 is also coupled to the first node 201. A gate of the transistor (N3) 230 is coupled to receive the ISO signal 202. A source of the transistor (N3) 230 is coupled to ground (0V). A source of the transistor (N4) 232 is coupled to ground (0V). A gate of the transistor (N4) 232 is coupled to receive the ISO signal 202. A drain of the transistor (N4) 232 is coupled to an output of the inverter (INV1) 234 and the input of the inverter (INV2) 240. The inverter (INV1) 234 is biased by the VDD signal 206 and ground (0V). The input of the inverter (INV1) 234 is coupled to a drain of the transistor (N5) 242. The drain of the transistor (N5) 242 is also coupled to an output of the inverter (INV2) 240, and an input of the inverter (INV1) 234, and the second node 203 which carries the ISO_DEL signal 248. A source of the transistor (N5) 242 is coupled to ground (0V). A gate of the transistor (N5) 242 is coupled to the capacitor (C) 244. The capacitor (C) 244 is coupled between the first node 201 and a ground potential (i.e., ground). The inverter (INV2) 240 is biased by the VDD signal 206 and ground (0V). An output of the inverter (INV2) 240 is coupled to an input of the inverter (INV1) 234.

The level shifter 250 includes a VDD signal 206, a transistor (P6) 256, a transistor (P7) 258, a transistor (N6) 260, a transistor (N7) 262, an input signal IN 264, a transistor (N8) 266, a VCC signal 268, an inverter INV3 276, a transistor (N9) 270, an AND gate 272, and an output signal OUT 274.

The inverter INV3 276 may include a complementary pair of MOSFETs (e.g., a PMOS and an NMOS). In the inverter INV3 276, the drains of an NMOS and PMOS are coupled to each other. The inverter INV3 276 may also be referred to as a CMOS having an NMOS and PMOS.

The output signal OUT 274 of the level shifter 250 may be provided to high voltage logic (for example, high voltage logic in the memory array). In an embodiment, the level shifter 250 shifts a low voltage domain input signal IN 264 into a high voltage domain logical level output signal OUT 274. The ISO signal 202 in the biasing circuit 210 is introduced when one power domain (e.g., VDD) is present and the other power domain (e.g., VCC) is absent. For example, if the VCC signal 268 is generated by a regulator, and the VCC signal 268 is not present when the regulator is turned off, the VCC signal 268 may be floating. The output signal OUT 274 should not be in an uncertain state (i.e., at a voltage between power and ground). Therefore, the ISO signal 202 is used to force the output signal OUT 274 into a valid logical state and ISO signal 202 is generated whenever the VCC power domain is not present.

The level shifter 250 receives the VPROT signal 246 from the first node 201 and the ISO_DEL signal 248 from the second node 203 from the biasing circuit 210. A gate of the transistor (N6) 260 is coupled to the first node 201 to receive the VPROT signal 246. A gate of the transistor (N7) 262 is also coupled to the first node 201 to receive the VPROT signal 246. A drain of the transistor (N6) 260 is coupled to a drain of the transistor (P6) 256 which is also coupled to a gate of the transistor (P7) 258. A source of the transistor (P6) 256 is coupled to receive the VDD signal 206. A gate of the transistor (P6) 256 is coupled to a drain of the transistor (P7) 258, which is also coupled to the AND gate 272, and a drain of the transistor (N7) 262. A source of the transistor (P7) 258 is coupled to receive the VDD signal 206. A source of the transistor (N7) 262 is coupled to a drain of the transistor (N9) 270. A source of the transistor (N9) 270 is coupled to ground (0V). A gate of the transistor (N9) 270 is coupled to an output of the inverter INV3 276. The inverter INV3 276 is biased by the VCC signal 268 and ground (0V). An input of the inverter INV3 276 is coupled to receive the input signal IN 264. A drain of the transistor (N8) 266 is coupled to a source of the transistor (N6) 260. A gate of the transistor (N8) 266 is also coupled to receive the input signal IN 264. A source of the transistor (N8) 266 is coupled to ground (0V). The AND gate 272 is coupled to receive the second node 203 carrying the ISO_DEL signal 248. The AND gate 272 outputs the signal OUT 274.

In the depicted embodiment, the ISO_DEL signal 248 is generated by circuitry including the inverters (INV1) 234 and (INV2) 240, and the transistors (N5) 242 and (N4) 232.

The level shifter 250, in response to being biased by the biasing circuit 210, transforms a domain of the input signal IN 264 into different domain to output the transformed signal as OUT 274.

The biasing circuit 210 optimizes a response time (i.e., a time that required to charge up the VPROT signal 246 to an appropriate level as fast as possible without burning excessive current in standby). In an embodiment, the biasing circuit 210 may also ensure that during the ramping up period of the VPROT signal 246, the level shifter (and the output signal OUT 274) is not left in an uncertain state where the output of the level shifter 250 can be anything due to transistors that may be floating. Details regarding the ramping up period are described herein.

In order for the biasing circuit 210 to optimize the response time, the biasing circuit 210 utilizes the first branch 214 and the second branch 238 to control the current injected into the diode stack 228. Specifically, the timer component 204 is used to control injection of an appropriate current into the diode stack 228 (via the first branch 214 and/or the second branch 238) so that the capacitor (C) 244 is charged up as quickly as possible and then the biasing circuit 210 reverts to lower standby current in order to maintain a level of the VPROT signal 246 with minimum current consumption. The capacitor (C) 244 is charged in response to the current source ISRC 222 injecting additional current for the period of time into the diode stack 228.

As described above, the capacitor (C) 244 models the parasitic capacitance presented by the inputs of one or more level shifters 250 connected to the first node 201, where multiple level shifters are coupled to the first node 201 in parallel.

The first branch 214 and/or the second branch 238 can inject appropriate current into the diode stack 228 to charge up the VPROT signal 246. The timer component 204 is coupled to receive at its input the ISO signal 202. When the ISO signal 202 is transitioning between a high level and a low level, the timer component 204 generates a pulse when the ISO signal 202 is at a low level. The timer component 204, which is coupled to the gate of the transistor (P4) 208, activates/turns on the transistor (P4) 208 in the first branch 214. When the transistor (P4) 208 is activated/turned on, the transistors (P1) 216 and (P2) 218 are also turned on. The current source ISRC 222 supplies current into the diode stack 228, which includes the transistors (N1) 224 and (N2) 226. When the additional current is supplied to the diode-connected transistors (N1) 224 and (N2) 226, the VPROT signal 246 on the first node 201 ramps up. When the VPROT signal 246 transitions between low and high, this is referred to as ramping up. Prior to the ISO signal 202 transitioning between high and low, the VPROT signal 246 may be at ground. However, when the timer component 204 injects additional current into the diode stack 228, via the first branch 214, the VPROT signal 246 transitions from low to high. During the ramping up period, the transistors (P5) 212 and (P3) 220 in the second branch 238 supply a standby current, via mirroring devices, into the diode stack 228. The standby current is supplied via the mirroring devices which include the transistors (P1) 216, (P2) 218, and (P3) 220 and the standby current is injected into the diode stack 228 by control of the transistors (P5) 212 and (P3) 220. The transistor (P5) 212 may also be referred to as a switch. The transistors (P5) 212 and (P3) 220 are activated/turned on and the current is used in ramping up the VPROT signal 246. The transistors (N3) 230 and (N4) 232 are turned on initially when the ISO signal 202 is high. The drain of the transistor (N3) 230 is coupled to the first node 201 and the VPROT signal 246 on the first node 201 is pulled to ground. A drain of the transistor (N4) 232 is also pulled to ground. At this point, the ISO_DEL signal 248 is high because the output of the inverter (INV2) 240 is at the VDD signal 206. The inverter (INV1) 234 outputs a logic low and the inverter (INV2) 240 outputs a logic high. The transistor (N5) 242 is off because the gate of the transistor (N5) 242, tied to the first node 201 (which carries the VPROT signal 246), is off. When the ISO signal 202 is low, the transistors (N3) 230 and (N4) 232 are turned off. The output of the inverter (INV1) 234 remains at ground, as the transistor (N4) 232 is off because the input of the inverter (INV1) 234 is kept at a high level by the inverter (INV2) 240. The input of the inverter (INV2) 240 is low also because the transistor (N4) 232 is off. The ISO_DEL signal 248 remains high until the VPROT signal 246 reaches a certain threshold voltage level (i.e., a VTN voltage). The VPROT signal 246 continues rising until the VPROT signal 246 reaches 2*VTN voltage (which is also referred to as a maximum voltage, VMAX). When the VPROT signal 246 reaches the 2*VTN voltage, the inverters (INV1) 234 and (INV2) 240 switch their logic states and the ISO_DEL signal 248 goes to ground. The capacitor (C) 244 charges up while the VPROT signal 246 ramps up. When the VPROT signal 246 reaches VMAX, additional current may not be supplied into the diode stack 228. Standby current may continue to be supplied into the diode stack 228.

In the depicted embodiment, additional current injected into the diode stack 228 is provided by ISRC 222 (via control of the timer component 204 and the transistors in the first branch 214). Standby current injected into the diode stack 228 is provided by the mirroring devices which include the transistors (P1) 216, (P2) 218, and (P3) 220.

As described above, the additional current from ISRC 222 is injected into the diode stack 228, via the first branch 214 by control of the timer component 204, for a limited amount of time. During that time, standby current is also being injected into the diode stack 228, via the second branch 238. Thus, the biasing circuit injects increased current into the diode stack, under timer control, which charges up capacitor C as fast as possible, then reverts to low standby current to maintain VPROT level with minimum current consumption.

When the VPROT signal 246 approximately reaches a maximum voltage, the timer component 204 expires and the first branch ceases injection of the current into the diode stack 228. Specifically, after the expiration of the timer, the timer component 204 takes the gate of transistor (P4) 208 to high and the transistor (P4) 208 is deactivated/switched off and standby current flows through the diode stack 228, via the second branch 238. When the transistor (P4) 208 is deactivated/switched off, the transistor (P2) 218 is also deactivated/switched off, as the drain of the transistor (P4) 208 is coupled to a source of the transistor (P2) 218. After the expiration of the timer, the second branch 238 injects standby current into the diode stack 228. The transistors (P5) 212 and (P3) 220 remain activated/switched on and the standby current is provided onto to the first node 201 (which carries the VPROT signal 246). Therefore, the VPROT signal 246 is injected with the standby current (and not with additional current), as it has already reached a maximum voltage level and no longer needs to be ramped up. The transistors (N3) 230 and (N4) 232 are then turned off/deactivated. The transistor (N5) 242 is on because the VPROT signal 246 has already reached a certain maximum voltage level (i.e., VMAX voltage). The output of the inverter (INV2) 240 is low and the ISO_DEL signal 248 is low (i.e., is at ground). The level shifter 250 is enabled and passes on its output OUT 274, which is an expected logic signal.

By using the dual branches, the VPROT signal 246 carried on the first node 201 is initially charged up very quickly at a higher current rate and when the VPROT signal 246 approximately reaches a maximum voltage, the additional current is no longer injected into the diode stack 228. The standby current continues to flow through the diode stack 228, via the second branch 238. In an embodiment, the initial extra injection of current followed by the injection of only standby current into the diode stack 228 allows for a system which does not exceed a standby current budget. A standby current budget may be a total current budget for a device implementing the biasing circuit and the level shifter.

In an embodiment, if multiple level shifters are biased on the same VPROT line, the capacitor (C) 244 can be significant in size and meeting a fast transition time may require a large current to be injected in the diode stack 228. When VPROT signal 246 has reached the required level, the timer component controls circuitry to reduce the additional current.

In an embodiment, the first branch 214 and the second branch 238 are parallel paths for injecting current into the diode stack 228. The transistors (P4) 208 and (P5) 212 perform switching functions for each of the first branch 214 and the second branch 238, respectively, and control the injection of current into the diode stack 228. The transistors (P2) 218 and (P3) 220 are depicted as being in a current mirror configuration with transistor (P1) 216. The current that flows through each of the transistors (P1) 216, (P2) 218 and (P3) 220 is supplied by the source current ISRC 222. When the transistor (P4) 208 is activated by the component 204, the transistor (P4) 208 acts as a switch to allow current to flow through into the diode stack 228 via the transistor (P2) 218. The transistor (P5) 212 may also act as a switch to allow standby current to flow into the diode stack 228 via the transistor (P3) 220.

When the ISO signal 202 transitions from low to high, the transistor (P5) 212 is deactivated/switched off as well as the transistor (P3) 220. The transistor (N3) 230 is turned on when the ISO signal 202 is high. The transistor (N3) 230 pulls the VPROT signal 246 to ground.

As described above with respect to FIG. 1, a delay period occurs in the power domain transition. During the delay period in the power domain transition from the moment an ISO signal is grounded and the moment that the level shifter 250 (and other level shifters) becomes operational, the ISO signal may have been grounded, but the level shifter 250 has not yet become operational. In the past, during this delay period, a state of the level shifter and an output of the level shifter may be in an uncertain state. The output provided may be an erroneous invalid logical signal. In order to prevent the output from being in an uncertain state and to guarantee isolation during this delay period, the biasing circuit 210 provides an ISO_DEL signal 248 to the level shifter 250.

A full latch, including the inverters (INV1) 234 and (INV2) 240, is used by the biasing circuit 210 to provide the ISO_DEL signal 248. As described above, the ISO_DEL signal 248 remains high until the VPROT signal 246 reaches a voltage level equal to the certain threshold voltage level of transistor (N5) 242 (i.e., a VTN level). Until the VPROT signal 246 reaches the voltage level equal to the threshold voltage of the transistor (N5) 242, the output signal OUT 274 in the level shifter 250 remains disabled because the high ISO_DEL signal 248 is input into the AND gate 272 and the AND gate 272 is forced to 0V. The output signal OUT 274 remains in this state regardless of what other inputs are provided to the AND gate 272. The output signal OUT 274 may only change (from a valid logic state) after the state of the ISO_DEL signal 248 changes between high and low. The state of the ISO_DEL signal 248 changes when the VPROT signal 246 ramps up sufficiently to turn on the transistor (N5) 242 in the biasing circuit 210. When the VPROT signal 246 (which ramps up from ground to a maximum voltage) exceeds a threshold voltage of the transistor (N5) 242, the transistor (N5) 242 is activated/turned on. When transistor (N5) 242 is activated/turned on, the ISO_DEL signal 248 is grounded. The input of the AND gate 272 after one inversion is high, and the signal that is on the drain of the transistor (P7) 258 is passed onto the other input of the AND gate 272 and to the output signal OUT 274. When the transistor (N5) 242 in the biasing circuit 210 is activated/turned on, the transistors (N6) 260 and (N7) 262 are also activated/turned on (as all these transistors are similar to one another). Therefore, when the transistors (N6) 260 and (N7) 262 are activated/turned on, the logic state of the level shifter input IN 264 is passed onto the drain of device (P7) 258.

When the inverted input into the AND gate 272 is low, the output of the AND gate 272 and the output signal OUT 274 is also low. Thus, the output signal OUT 274 will be 0, which may ensure that an erroneous invalid logical signal is not output.

The biasing circuit 210 delays the isolate signal by using the ISO_DEL signal 248. The ISO_DEL signal 248 is provided to the level shifter 250 and remains high until the VPROT signal 246 reaches a high voltage (HV) NMOS threshold. The ISO_DEL signal 248 guarantees isolation as the output of the level shifter 250, OUT 274, remains at 0v while the drains of the transistors (N6) 260 and (N7) 262 float.

Generation of the pulse by the timer component 204 and resetting the timer component 204 may be based on circuit simulations. A value of the parasitic capacitor (C) 244 may be utilized to determine the period of time that the timer component 204 should generate a pulse and when it should reset. Another factor besides capacitance that may be used includes an amount of current ISRC 222 flowing into the diode stack 228. The current ISRC 222 and the capacitor (C) 244 may be compared to similar past circuit simulations in order to determine how long the timer component 204 should generate a pulse and when it should reset. A timer component of one biasing circuit may be set differently than another time component of another biasing circuit.

Figure 3:
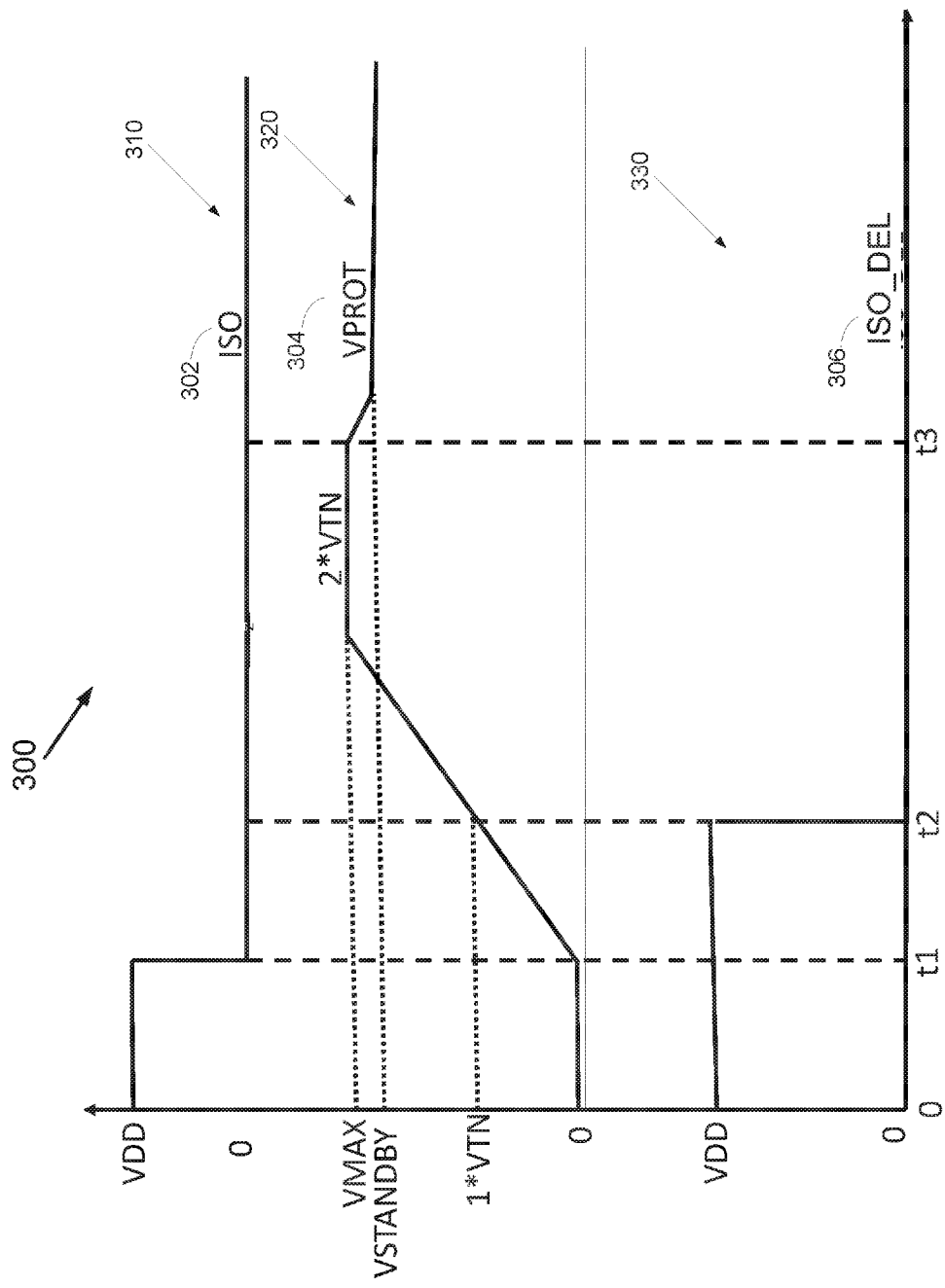
FIG. 3 is a timing diagram, according to one embodiment.

As described herein in FIG. 3, the timer component does not reset until the VPROT signal reaches a maximum voltage level.

By generating the VPROT signal 246, the biasing circuit 210 in FIG. 2 may provide for low direct current (DC) consumption, and a fast response time from a time when the ISO signal 202 transitions between high and low to the time that the VPROT signal 246 reaches its steady DC value. The timer component that provides for controlling of additional current to be injected into diode stack may improve startup time while preserving low standby current consumption.

The biasing circuit 210 may also provide guaranteed isolation during the ramp up period of the VPROT signal 246, as the output signal of the level shifter 250, OUT 274, is kept at a known valid logic level during the ramp up period of the VPROT signal 246, during power domain transition (i.e., when the ISO signal 202 is low, but the VPROT signal 246 has not yet reached its DC value which is a maximum voltage value also known as a threshold voltage of the NMOS devices (N6) 260 and (N7) 262). Thus, the biasing circuit 210 guarantees full isolation of the level shifter 250 during power domain switching.

In an embodiment, the biasing circuit 210 allows a power-up (wakeup) time of less than 10 microseconds and a standby current consumption of less than 1 micro amp (for the biasing circuit 210), while biasing multiple level shifters (e.g., 2400 or more level shifters).

FIG. 3 is a timing diagram 300, according to one embodiment. The timing diagram 300 depicts the timing of the ISO signal 302, the VPROT signal 304, and the ISO_DEL signal 306. The timing of ISO signal 302, the VPROT signal 304, and the ISO_DEL signal 306 corresponds to the ISO signal 202, the VPROT signal 246, and the ISO_DEL signal 248 in FIG. 2, respectively. The timings may also correspond to the ISO signal 406, the VPROT signal 438, and the ISO_DEL signal 440 in FIG. 4A. The timings may also correspond to the ISO signal 455, the VPROT signal 484, and the ISO_DEL signal 486 in FIG. 4B.

In FIG. 3, the y-axis of the timing diagram 310 for the ISO signal includes voltage levels ranging from 0V to VDD. The y-axis of the timing diagram 320 for the VPROT signal includes voltages ranging from 0V to 2*VTN. The y-axis of the timing diagram 330 for the ISO_DEL signal includes voltages ranging from 0V to VDD. The x-axis of the timing diagrams 310, 320, and 330 all include time ranging from 0 to t3 (and including times t1 and t2).

The timing diagram 310 shows that the ISO signal starts out as high (VDD) at time 0 and transitions from high to low voltage (0V) at time t1. When the ISO signal is high (before time t1), the VPROT is at 0V and the ISO_DEL signal is at VDD. At time t1, the ISO signal transitions to a low voltage (0V) which triggers the timer component to generate a pulse.

The timing diagram 320 shows that the VPROT signal starts out as low (0V) at time 0, shifts from low to high voltage at time t1, continues to ramp up to high voltage from time t1 to time t2 and reaches a maximum voltage (VMAX) sometime between time t2 and t3. A first threshold level includes a voltage range between 0V and a level voltage (VTN) (i.e., in between time 0 and time t2). The timing diagram 320 depicts the VPROT signal as being approximately equal to 1*VTN at time t2. A second threshold level includes a voltage range between the VTN and a maximum voltage which is 2*VTN (i.e., in between time t2 and time t3).

At time t2, the VPROT signal exceeds VTN which turns on the transistor (N5) 242 and pulls the ISO_DEL signal to ground (0V). The VPROT signal after time t2 is high enough (>1*VTN) to guarantee correct operation for the level shifter.

The timing diagram 330 shows that the ISO_DEL signal starts out as high (VDD) at time 0 and transitions from high to low (0V) at time t2.

Referring again to the timing diagram 310, when the ISO signal transitions from high to low, the timer component is triggered to generate a pulse signal at time t1. When the timer component generates the pulse, the capacitor begins charging, as additional current is injected into the 1st node carrying the VPROT signal. At time t1, the VPROT signal depicted in the timing diagram 320 begins ramping up from ground (0V) until it reaches VMAX (i.e., 2*VTN) in between time t2 and t3. At time t3, the timer component resets and the pulse switches off. While the VPROT signal is ramping up, additional current is injected into the diode stack along with standby current. At time t3, the injection of the additional current ceases when the timer resets, which turns off the devices injecting additional current into the load circuit. These devices may be the transistors (P4) 208 and (P2) 218 in the first branch 214 in FIG. 2. The current consumption of the biasing circuit is reduced at time t3. Standby current continues to be injected into the diode stack at time t3 (and beyond). As the current that is injected into the diode stack decreases to standby current (and no longer includes both standby current and additional current), the VPROT signal drops slightly in voltage. This drop in voltage is shown after time t3. Therefore, after time t3, the VPROT signal stabilizes and drops from VMAX (i.e., 2*VTN) until the VPROT signal reaches a standby voltage (VSTANDBY). The voltage of the VPROT signal continues to drop until the VPROT signal reaches VSTANDBY, as shown in the timing diagram 320. The drop may occur because before the timer component shuts off the devices in the first branch 214 (at time t3), some additional current is injected which may drive the voltage of VPROT beyond VSTANDBY. The VPROT signal may reach VMAX (2*VTN). In order to bring VPROT back down to VSTANDBY, a slight drop in voltage may occur, as depicted.

In the timing diagram 330, the ISO_DEL signal is high (VDD) at time 0. The ISO_DEL signal continues to stay high until the point where the VPROT signal reaches a VTN level at time t2. The ISO_DEL continues to stay high due to the full latch depicted in FIGS. 2 and 4A, or due to the voltage comparator depicted in FIG. 4B. Details regarding FIGS. 4A and 4B are provided herein.

At time t2, when the VPROT signal reaches the 1*VTN level (as shown in the timing diagram 320), the ISO_DEL signal transitions to low voltage (0V). The ISO_DEL signal continues to be at low voltage beyond t2, t3, etc.

As depicted in FIG. 3, in response to the ISO signal including a high voltage, the ISO_DEL signal including a high voltage. In response to the ISO signal including a low voltage when the VPROT signal is within the first threshold level, the ISO_DEL signal includes a high voltage. In response to the ISO signal including a low voltage when the VPROT signal transitions from the first threshold level to the second threshold level, the ISO_DEL signal includes a low voltage.

FIGS. 4A and 4B illustrates a circuit schematic of alternative biasing circuits, according to another embodiment.

FIG. 4A illustrates a circuit schematic 401 of a third biasing circuit, according to another embodiment. A biasing circuit 400 includes a current source ISRC 402, a VDD signal 404, an ISO signal 406, a timer component 408, a transistor (N9) 410, a transistor (P1) 412, a transistor (P2) 414, a transistor (N6) 416, a transistor (N8) 418, a transistor (N7) 420, a transistor (N1) 422, a transistor (N2) 424, a transistor (N3) 426, a transistor (N4) 428, an inverter (INV1) 430, an inverter (INV2) 432, a transistor (N5) 434, a capacitor (i.e., a parasitic capacitor) (C) 436, a VPROT signal 438, and an ISO_DEL signal 440.

In FIG. 4A, the VPROT signal 438 and the ISO_DEL signal 440 are similar to the VPROT signal 246 and the ISO_DEL signal 248, respectively, depicted in FIG. 2.

In FIG. 4A, a full latch including the inverters (INV1) 430 and (INV2) 432 are used to generate the ISO_DEL signal 440.

FIG. 4B illustrates a circuit schematic 451 of a fourth biasing circuit, according to another embodiment. A biasing circuit 450 includes a current source (ISRC1) 452, a VDD signal 454, an ISO signal 455, a timer component 458, a transistor (N5) 456, a transistor (P1) 460, a transistor (N6) 467, a transistor (N8) 469, a transistor (N7) 466, a transistor (P2) 468, a transistor (N1) 470, a transistor (N2) 472, a transistor (N3) 474, a transistor (N4) 478, a current source (ISRC2) 476, a voltage comparator 480, a capacitor (i.e., a parasitic capacitor) (C) 482, a VPROT signal 484, and an ISO_DEL signal 486.

In FIG. 4B, the VPROT signal 484 and the ISO_DEL signal 486 are similar to the VPROT signal 246 and the ISO_DEL signal 248, respectively, depicted in FIG. 2.

In FIG. 4B, instead of a full latch and an NMOS transistor N5 as in FIGS. 2 and 4A, a voltage comparator 480 is used to generate the ISO_DEL signal 486. Therefore, the ISO_DEL signal may be generated by a pair of inverters (i.e., a full latch), as depicted in FIGS. 2 and 4A, or by a voltage comparator, as depicted in FIG. 4B.

For purposes of brevity and simplicity, the transistor (P4) 208 is coupled to timer component 204 in FIG. 2. Similarly, the transistor (N6) 416 is coupled to the timer component 408 in FIG. 4A and the transistor (N6) 467 is coupled to the timer component 458 in FIG. 4B. However, a switch or a switching element may be provided instead of the depicted transistors. Moreover, more than one transistor, switch or switching element may be coupled to the timer component. For example, a series of transistors, switches and/or switching elements may be coupled to any of the timer components depicted in FIG. 2, 4A, or 4B. A series of transistors, switches and/or switching elements may be laid out in parallel to one another, connected in a series, or laid out in another pattern.

FIG. 5 is a flow diagram illustrating biasing provided during transition of an isolation signal between a high voltage and a low voltage, according to one embodiment. Method 500 may be performed by the biasing circuit 210, the biasing circuit 400, or the biasing circuit 450 as shown in FIGS. 2, 4A, and 4B, respectively, and any of the biasing circuit 210, the biasing circuit 400, or the biasing circuit 450 may perform some or all of the operations described herein. For purposes of brevity and simplicity, the biasing circuit 210 shown in FIG. 2 is described herein. However, the biasing circuit 400 or the biasing circuit 450 may perform any or all of the operations described herein.

Method 500 begins at block 510 where an input of the timer component 204 receives an isolation (ISO) signal. In an embodiment, the timer component of the timer component 204 receives at an input the ISO signal.

Method 500 continues to block 520 where in response to a transition of the ISO signal between a high voltage and a low voltage, the current source ISRC 222 injects current for a period of time into a load circuit. In an embodiment, the load current is the diode stack 228. The current source ISRC 222 injects the current via control of the timer component 204. In an embodiment, the timer component 204 is coupled to the transistor (P4) 208 to control the current source ISRC 222. As described above with respect to FIG. 2, the transistor (P4) 208 is part of the first branch 214. The load circuit (e.g., diode stack 228) is coupled to the first node 201. The high voltage (HV) is higher than the low voltage (LV).

Method 500 continues to block 530 where the transistor (P4) 208 is activated in response to the transition of the ISO signal between the high voltage and the low voltage. In order to inject the current by the current source ISRC 222 into the load circuit, the transistor (P4) 208 is activated. In an embodiment, after the timer component 204 receives the ISO signal as an input in block 510, the timer component 204 generates a pulse which activates the transistor (P4) 208 for a period of time so that the current source ISRC 222 can inject current into the load circuit for the period of time. In the first branch 214, transistor (P4) 208 as well as transistor (P2) 218 is activated for the period of time in response to the transition of the ISO signal. During this time, the transistors (N1) 224 and (N2) 226 in the load circuit receive the additional current from the current source ISRC 222 via the transistors (P4) 208 and (P2) 218 in the first branch 214.

Method 500 continues to block 540 where a biasing signal (i.e., the VPROT signal 246) is output on the first node.

Method 500 continues to block 550 where the capacitor (C) 244 is charged in response to the injection of the current by the ISRC 222 (via the timer component 204 coupled to the transistors (P4) 208 and (P2) 218 in the first branch 214) into the load circuit. As current is injected into the load circuit, the VPROT signal 246 is high, which charges up the capacitor (C) 244.

Method 500 continues to block 560 where an isolation delayed (ISO_DEL) signal 248 is generated. The ISO_DEL signal 248 has a high voltage in response to the biasing signal (i.e., the VPROT signal 246) being within a first threshold level. The ISO_DEL signal 248 has a low voltage in response to the biasing signal being within a second threshold level. As described above with respect to the timing diagram of FIG. 3, the first threshold level includes a voltage range between 0V and a threshold level voltage (VTN) and the second threshold level includes a voltage range between the VTN and a maximum voltage.

Method 500 continues to block 570 where the ISO_DEL signal 248 is output on a second node.

In an embodiment, the timer component resets in response to the VPROT signal 246 approximately reaching the maximum voltage. After the VPROT signal approximately reaches the maximum voltage, the standby current continues to be injected into the load circuit which stabilizes the VPROT signal 246 until the VPROT signal 246 reaches a standby level voltage. The standby current is provided via the transistors (P5) 212 and (P3) 220 in the second branch 238, where these transistors control the injection of the standby current provided by the ISRC 222 into the load circuit.

In an embodiment, at the end of the time period (i.e., when the timer component resets) in block 520, the injection of the additional current by the ISRC 222 ceases by deactivating the transistor (P4) 208. The deactivation of the transistor (P4) 208 switches the first branch 214 off. When the injection of the additional current ceases, the transistors (P5) 212 and (P3) 220 in the second branch 238 continue injecting standby current into the load circuit. Details regarding the injection of the additional current and standby current and ceasing injection of the additional current are described herein with respect to FIG. 6.

Figure 6:
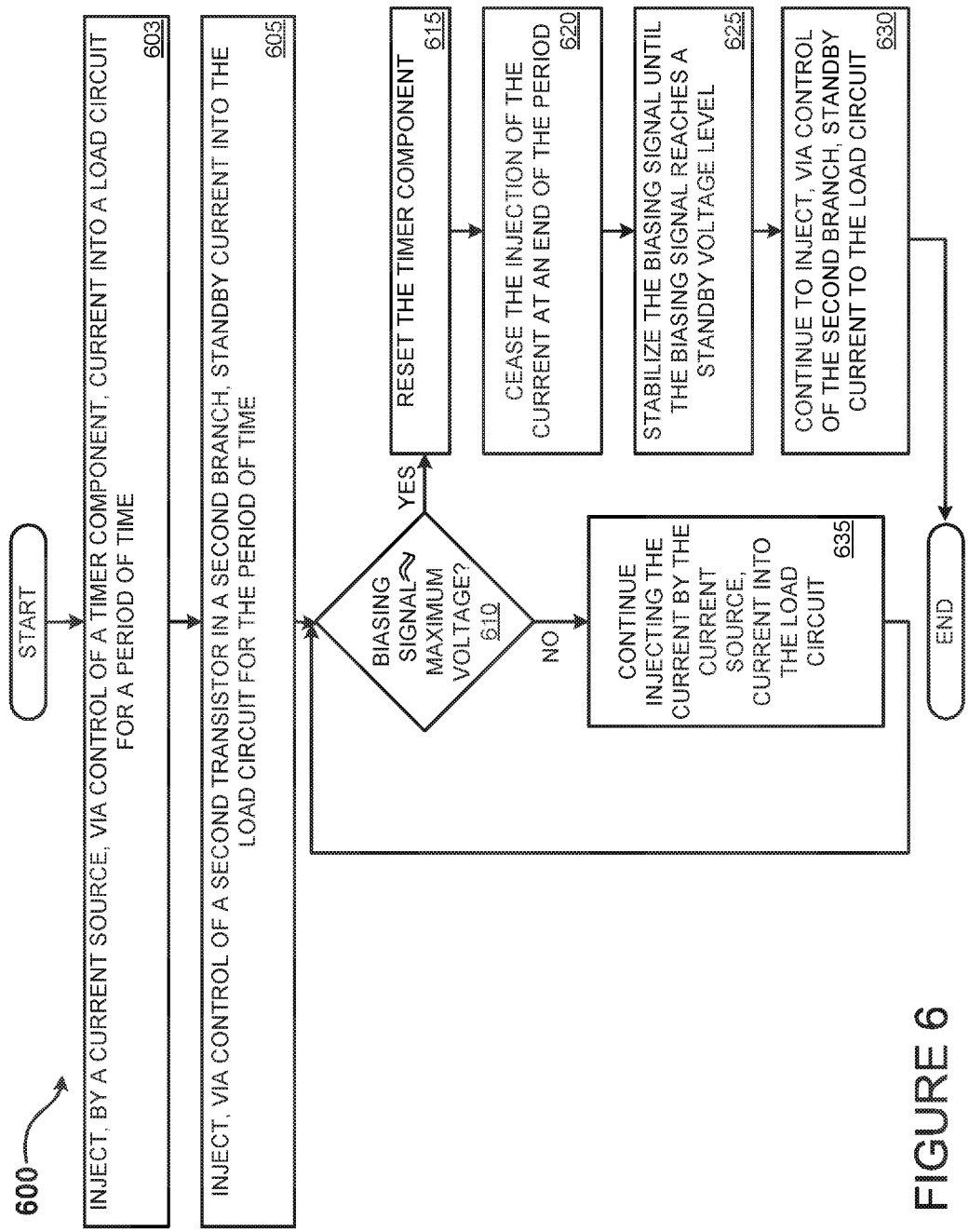
FIG. 6 is a flow diagram illustrating injection of current into a load circuit, according to one embodiment.

FIG. 6 is a flow diagram illustrating injection of current into a load circuit, according to one embodiment. Method 600 may be performed by the biasing circuit 210, the biasing circuit 400, or the biasing circuit 450 as shown in FIGS. 2, 4A, and 4B, respectively, and any of the biasing circuit 210, the biasing circuit 400, or the biasing circuit 450 may perform some or all of the operations described herein. For purposes of brevity and simplicity, the biasing circuit 210 shown in FIG. 2 is described herein. However, the biasing circuit 400 or the biasing circuit 450 may perform any or all of the operations described herein.

Method 600 begins at block 603 where current is injected by the current source ISRC 222, via control of the timer component 204 (coupled to the transistor (P4) 208 in the first branch 214), into the load circuit for a period of time. In an embodiment, the load circuit is the diode stack 228. As described above with respect to FIG. 5, block 520, the current (which is an additional or extra current) is injected in response to a transition of the ISO signal 202 between a high voltage and a low voltage.

Method 600 continues to block 605, where standby current is injected into the load circuit, via control of the transistor (P5) 212 in the second branch 238, for the period of time.

Method 600 continues to decision block 610, where it is determined whether the biasing signal (i.e., the VPROT signal 246) approximately equals the maximum voltage. If the biasing signal does not approximately equal the maximum voltage, and the decision block returns a "No" decision, the method 600 continues to block 635.

At block 635, the current and the standby current are continuously injected into the load circuit. The method 600 loops back to decision block 610.

If the biasing signal approximately equals the maximum voltage, and the decision block returns a "Yes" decision, the method 600 continues to block 615.

At block 615, the timer component 204 is reset.

Method 600 continues to block 620, where the injection of the additional current by the ISRC 222 ceases at the end of the period.

Method 600 continues to block 625, where the biasing signal (i.e., the VPROT signal 246) stabilizes until the biasing signal reaches a standby voltage level. The stabilization may occur in response to the transistors (P5) 212 and (P3) 220 controlling injection of the standby current to the load circuit.

Method 600 continues to block 630, where the standby current continues to be injected into the load circuit by the ISRC 222, via control of the second branch 238.

Method 600 then ends.

NVM devices may utilize the biasing circuits depicted in FIGS. 2, 4A and 4B. Other devices requiring power domain transition other than NVM devices may also utilize the biasing circuits depicted in FIGS. 2, 4A and 4B and the biasing circuits are not limited to memory devices.

It should be appreciated that some of the different voltage levels and electrical connections illustrated in FIGS. 2, 4A and 4B may not be described herein. A person of reasonable skill in the art would be able to determine the different voltage levels and electrical connections in view of the Figures herein, in particular FIGS. 2, 4A and 4B.

Embodiments of the present invention include various operations described herein. These operations may be performed by hardware components, software, firmware, or a combination thereof.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner. The terms "first," "second," "third," "fourth," etc. as used herein are meant as labels to distinguish among different elements and may not necessarily have an ordinal meaning according to their numerical designation.

The above description sets forth numerous specific details such as examples of specific systems, components, methods, and so forth, in order to provide an understanding of several embodiments of the present invention. It may be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

What is claimed is:

1. A circuit comprising:
   a level shifter; and
   a biasing circuit coupled to the level shifter, the biasing circuit comprising:
   a load circuit coupled to a first node that is coupled to the level shifter, the biasing circuit to output a biasing signal on the first node;
   a timer component and a current source, wherein an input of the timer component is coupled to receive an isolation (ISO) signal, wherein the current source is configured to inject current for a period of time, as determined by the timer component, into the load circuit in response to a transition of the ISO signal between a high voltage and a low voltage, wherein the high voltage is higher than the low voltage; and
   circuitry to generate an isolation delayed (ISO_DEL) signal, wherein the ISO_DEL signal comprises a high voltage in response to the biasing signal being within a first threshold level and wherein the ISO_DEL signal comprises a low voltage in response to the biasing signal being within a second threshold level, the biasing circuit to output the ISO_DEL signal to the level shifter on a second node.

2. The circuit of claim 1, wherein the biasing circuit further comprises a capacitor coupled between the first node and a ground potential, wherein the capacitor is charged in response to the current source injecting the current for the period of time into the load circuit.

3. The circuit of claim 1, wherein the biasing circuit and the level shifter are comprised within a non-volatile memory device.

4. The circuit of claim 1, wherein in response to the ISO signal comprising a high voltage, the ISO_DEL signal comprises a high voltage, wherein in response to the ISO signal comprising a low voltage when the biasing signal is within the first threshold level, the ISO_DEL signal comprises a high voltage and wherein in response to the ISO signal comprising a low voltage when the biasing signal transitions from the first threshold level to the second threshold level, the ISO_DEL signal comprises a low voltage.

5. The circuit of claim 1, wherein the biasing circuit further comprises:
   a first branch comprising a transistor, wherein the timer component is coupled to the transistor; and
   a second branch that is configured to provide standby current to the load circuit in response to the current source ceasing injection of the current at an end of the period.

6. The circuit of claim 5, wherein the transistor is activated in response to the transition of the ISO signal between the high voltage and the low voltage.

7. The circuit of claim 1, wherein the circuitry to generate the ISO_DEL signal comprises at least one of: a pair of inverters or a voltage comparator.

8. The circuit of claim 1, wherein the first threshold level comprises a voltage range between zero volts and a threshold level voltage and wherein the second threshold level comprises a voltage range between the threshold voltage level and a maximum voltage.

9. The circuit of claim 8, wherein the biasing circuit further comprises a transistor, wherein the timer component is coupled to the transistor, wherein the timer component is configured to reset the timer component in response to the biasing signal approximately reaching the maximum voltage and after the biasing signal approximately reaches the maximum voltage, a second and third transistor control injection of a standby current to the load circuit which stabilizes the biasing signal until the biasing signal reaches a standby level voltage.

10. A method for biasing a circuit, the method comprising:
    receiving, at an input of a timer component, an isolation (ISO) signal;
    in response to a transition of the ISO signal between a high voltage and a low voltage, injecting current for a period of time into a load circuit by a current source via control of the timer component, wherein the load circuit is coupled to a first node and wherein the high voltage is higher than the low voltage;
    outputting on the first node a biasing signal;
    generating an isolation delayed (ISO_DEL) signal, wherein the ISO_DEL signal comprises a high voltage in response to the biasing signal being within a first threshold level and wherein the ISO_DEL signal comprises a low voltage in response to the biasing signal being within a second threshold level; and
    outputting on a second node the ISO_DEL signal.

11. The method of claim 10, further comprising charging a capacitor in response to the injecting.

12. The method of claim 10, further comprising:
    ceasing the injecting of the current at an end of the period by deactivating a transistor coupled to the timer component; and
    injecting standby current into the load circuit.

13. The method of claim 10, wherein the biasing circuit is comprised within a non-volatile memory device.

14. The method of claim 10, further comprising:
    resetting the timer component in response to the biasing signal approximately reaching a maximum voltage; and
    after the biasing signal approximately reaches the maximum voltage, injecting a standby current into the load circuit which stabilizes the biasing signal until the biasing signal reaches a standby level voltage.

15. A biasing circuit comprising:
    a load circuit comprising a plurality of transistors, the load circuit coupled to a first node;
    a timer component, coupled to a first branch, wherein an input of the timer component is coupled to receive an isolation (ISO) signal;
    a current source configured to inject current for a period of time, as determined by the timer component, into the load circuit, via the first branch, in response to a transition of the ISO signal between a high voltage and a low voltage, wherein the high voltage is higher than the low voltage; and circuitry to generate an isolation delayed (ISO_DEL) signal, wherein the ISO_DEL signal comprises a high voltage in response to a biasing signal carried on the first node being within a first threshold level, wherein the ISO_DEL signal comprises a low voltage in response to the biasing signal being within a second threshold level, and wherein the biasing circuit outputs the biasing signal on the first node and outputs the ISO_DEL signal on a second node.

16. The biasing circuit of claim 15, further comprising a capacitor that is charged in response to the current source injecting the current for the period of time into the load circuit.

17. The biasing circuit of claim 15, further comprising a second branch, wherein in response to the period of time ending, the current source ceases injection of the current and the second branch is configured to provide standby current to the load circuit.

18. The biasing circuit of claim 15, wherein the biasing circuit outputs an output signal configured to be provided to a non-volatile memory device.

19. The biasing circuit of claim 15, wherein the first threshold level comprises a voltage range between zero volts and a threshold level voltage and wherein the second threshold level comprises a voltage range between the threshold level voltage and a maximum voltage.

20. The biasing circuit of claim 15, wherein the biasing circuit outputs the biasing signal and the ISO_DEL signal to a level shifter, wherein the level shifter transforms a received low voltage signal to a high voltage signal.

* * * * *